(12) United States Patent
Lee et al.

(10) Patent No.: US 8,788,553 B1
(45) Date of Patent: Jul. 22, 2014

(54) METHOD AND CIRCUIT FOR PROVIDING DIGITAL FREQUENCY SYNTHESIS

(75) Inventors: Ted Lee, San Lorenzo, CA (US); Alireza S. Kaviani, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 1207 days.

(21) Appl. No.: 12/361,341

(22) Filed: Jan. 28, 2009

(51) Int. Cl.
*G06F 1/02* (2006.01)

(52) U.S. Cl.
USPC .......................................................... 708/271

(58) Field of Classification Search
None
See application file for complete search history.

(56) References Cited

U.S. PATENT DOCUMENTS

| | | | |
|---|---|---|---|
| 6,028,488 A * | 2/2000 | Landman et al. | 327/159 |
| 6,384,647 B1 | 5/2002 | Logue | |
| 6,738,205 B1 * | 5/2004 | Moran et al. | 360/17 |
| 6,838,918 B1 * | 1/2005 | Kaviani | 327/159 |
| 7,236,026 B1 | 6/2007 | Samad et al. | |
| 7,409,028 B2 * | 8/2008 | Ham, III | 375/376 |
| 7,479,814 B1 | 1/2009 | Kaviani et al. | |
| 2009/0135885 A1* | 5/2009 | Lin | 375/130 |
| 2010/0073054 A1* | 3/2010 | Bereza et al. | 327/159 |

* cited by examiner

*Primary Examiner* — Idriss N Alrobaye
*Assistant Examiner* — Dayton Lewis-Taylor
(74) *Attorney, Agent, or Firm* — Gerald Chan

(57) ABSTRACT

An integrated circuit for providing digital frequency synthesis is disclosed. For example, the integrated circuit comprises a phase detector for receiving a reference clock signal and an oscillator clock signal, wherein the phase detector outputs an error signal. The integrated circuit further comprises a synthesizer control block, coupled to the phase detector, for receiving the error signal to generate a delay select signal, wherein the synthesizer control block comprises an integral adjustment filter and a proportional adjustment filter.

16 Claims, 7 Drawing Sheets

US 8,788,553 B1

METHOD AND CIRCUIT FOR PROVIDING DIGITAL FREQUENCY SYNTHESIS

FIELD OF THE INVENTION

This invention relates generally to integrated circuits, and in particular, to a circuit for and method of generating a clock signal.

BACKGROUND OF THE INVENTION

Internal clocks are an integral part of an integrated circuit, and are carefully controlled to ensure proper timing in the integrated circuit. Clock management circuits are used in an integrated circuit, such as a programmable logic device (PLD), to control timing of various clock signals of the device. Certain aspects of clock management circuits are often performed using phase-lock loop (PLL) circuits. In general, a PLL is used to synchronize the frequency and/or phase of an output clock signal to that of an input clock signal. In addition to their primary function of removing clock distribution delay, PLLs typically provide additional functionality such as frequency synthesis and phase shifting.

As shown in FIG. 1, a PLL 100 uses a voltage controlled oscillator 102, which generates a clock signal that approximates the input clock REFCLK. Control logic 104, consisting of a phase detector 106 and a filter 108, adjusts the oscillator frequency and/or phase to compensate for the clock distribution delay. The phase detector determines how much and in what direction the frequency and/or phase of the output clock signal should be adjusted relative to the input clock signal. The control logic 104 compares the input clock REFCLK to the feedback clock OSCCLK, and adjusts the oscillator clock until the rising edge of the input clock REFCLK aligns with the OSCCLK. Because a PLL generates its own clock signal by using an oscillator whose frequency of oscillation is adjusted to match a given input clock, a PLL may reduce the reference clock jitter.

A PLL could use either analog or digital circuitry. Each approach has its own advantages. For example, an analog implementation generally produces a PLL with a finer timing resolution, and sometimes consumes less silicon area. Conventional circuits using analog controlled PLLs maintain phase alignment through feedback loops with continuous gain from the phase error signal to control the oscillator. However, analog implementations can require additional power supplies which require close control. These analog implementations also typically necessitate large loop filter elements to give low loop bandwidths needed for jitter filtering applications. A large magnitude of jitter can cause the PLL's phase detector to fail and the system to lose lock.

Conversely, digital implementations offer advantages in noise immunity, lower power consumption and better jitter performance. Digital implementations also provide the ability to stop the clock, facilitating power management. Some conventional devices use digitally controlled loops with digitally quantized gain from the phase/frequency error signal to control the oscillator. However, these structures also typically have complex digital loop filters that require significant area.

SUMMARY OF THE INVENTION

In one embodiment, an integrated circuit for providing digital frequency synthesis is disclosed. For example, the integrated circuit comprises a phase detector for receiving a reference clock signal and an oscillator clock signal, wherein the phase detector outputs an error signal, and a synthesizer control block, coupled to the phase detector, for receiving the error signal to generate a delay select signal, wherein the synthesizer control block comprises an integral adjustment filter and a proportional adjustment filter.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

A majority of clocking solutions are often based on PLLs, where all-digital implementations are more attractive due to the ease of integration and scaling. In general, phase lock applications using hard phase alignment is effective generally when the input clock jitter is insignificant. In contrast, frequency aligned applications is effective to filter input clock jitter, but its effectiveness is achieved at the expense of having no phase alignment. Frequency aligned applications is also effective where following input clock phase is irrelevant as in multi-synchronous systems. Thus, it would be advantageous to achieve the low output jitter of the frequency aligned mode along with the low phase error of the phase aligned mode. This would enable a digital frequency synthesis implementation to operate with characteristics similar to a PLL, which is useful for applications with low to average input clock jitter. In one embodiment of the present invention, a novel circuit is disclosed where a digital frequency synthesis implementation is phase locked without hard phase alignment. In another embodiment, a novel circuit using hard phase alignment is able to reduce output clock jitter in the presence of input clock jitter.

Figure 1:
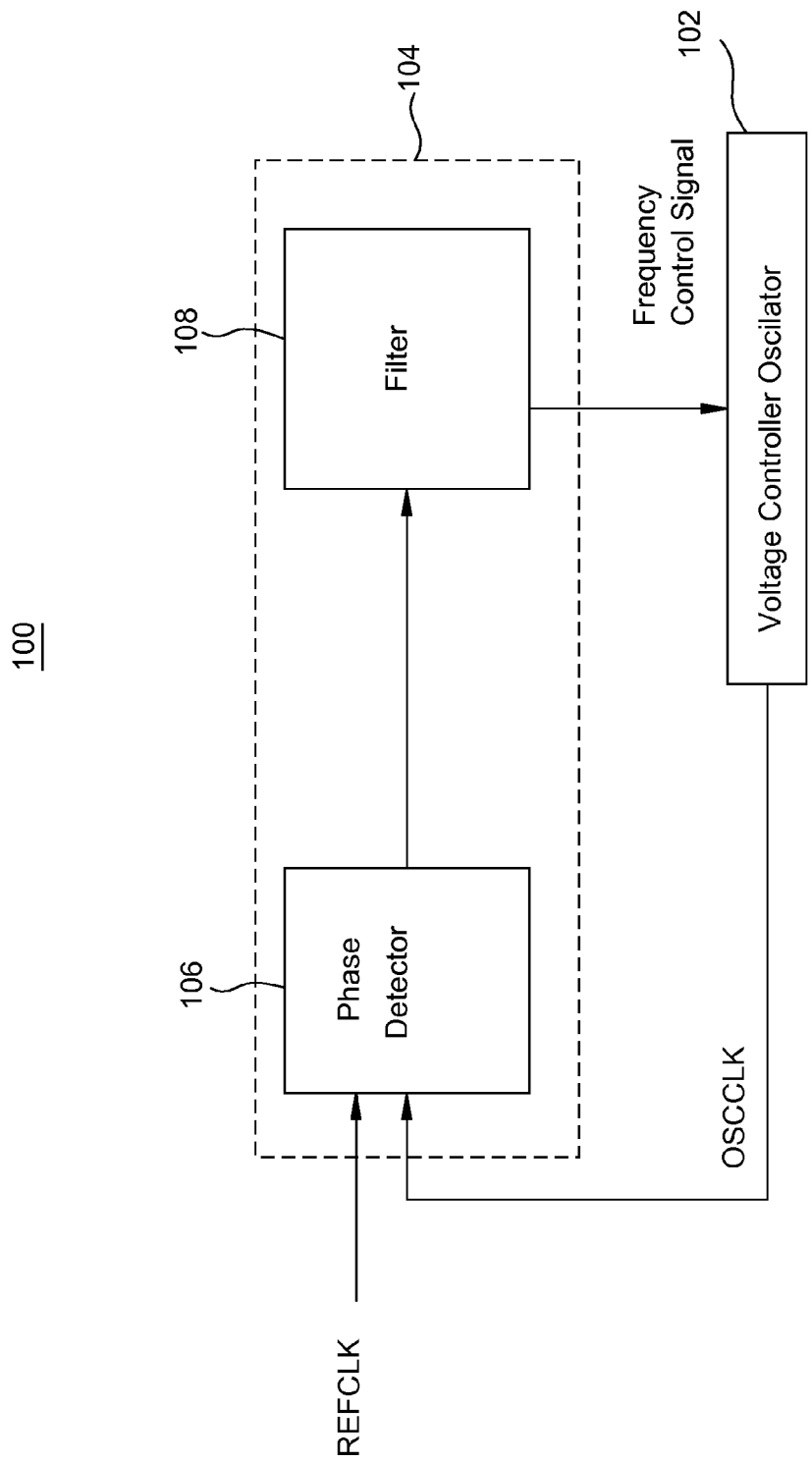
FIG. 1 illustrates a block diagram of a conventional phase-locked loop circuit.
Figure 2:
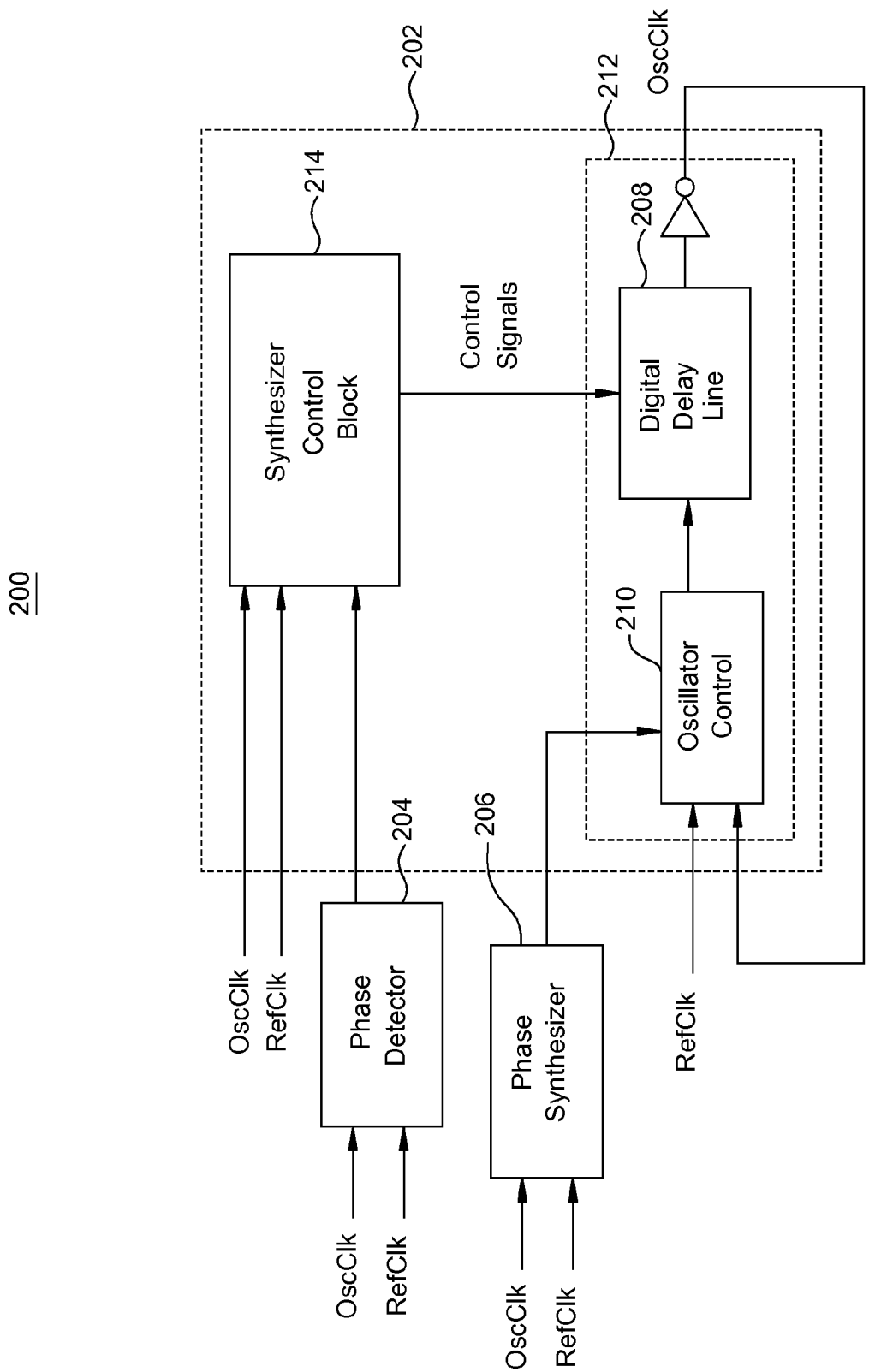
FIG. 2 is a block diagram of a circuit for generating a clock signal according to an embodiment of the present invention.

Turning first to FIG. 2, a block diagram of a circuit for generating a clock signal according to an embodiment of the present invention is shown. The block diagram of FIG. 2 generates a clock signal OscClk based upon a reference input clock signal RefClk. The generated clock signal OscClk is generated by clock generator 202 in response to a phase detector 204 and a phase synchronizer 206. Clock generator 202 could comprise a digital delay line 208 which is coupled to receive the output of an oscillator control circuit 210 of the oscillator circuit 212 and controlled by a synthesizer control block 214. The digital delay line could be, for example, a counter-controlled delay line. The digital delay line 208 is controlled by a synthesizer control block 214. The oscillator frequency is determined by the clock generator 202, but even with coarse and fine selection of the delays for the digital delay line, the clock generator will not maintain a precise frequency without some correction. Clock generator 202 could be implemented as described by commonly owned U.S. Pat. No. 6,384,647 entitled "Digital Clock Multiplier and Divider with Synchronization during Concurrences" by John D. Logue, the entire patent of which is incorporated by reference herein in its entirety. The clock generator of U.S. Pat. No. 6,384,647 is controlled by both a phase detector and a phase synchronizer, where the phase synchronizer periodically replaces the generated clock signal OscClk as it oscillates through the phase synchronizer with the reference clock signal RefClk in order to perform hard phase alignment.

Phase detector 204 compares its two input signals and applies a signal that guides clock generator 202 to adjust the frequency of the generated clock signal OscClk toward the desired frequency. To achieve the desired frequency the synthesizer control block 214 controls an oscillator which is formed by feeding back a delayed clock signal from clock generator 202 through an inverter to phase synchronizer 206. When the frequency is not correct, it is adjusted in the direction dictated by the phase detector 204.

Figure 3:
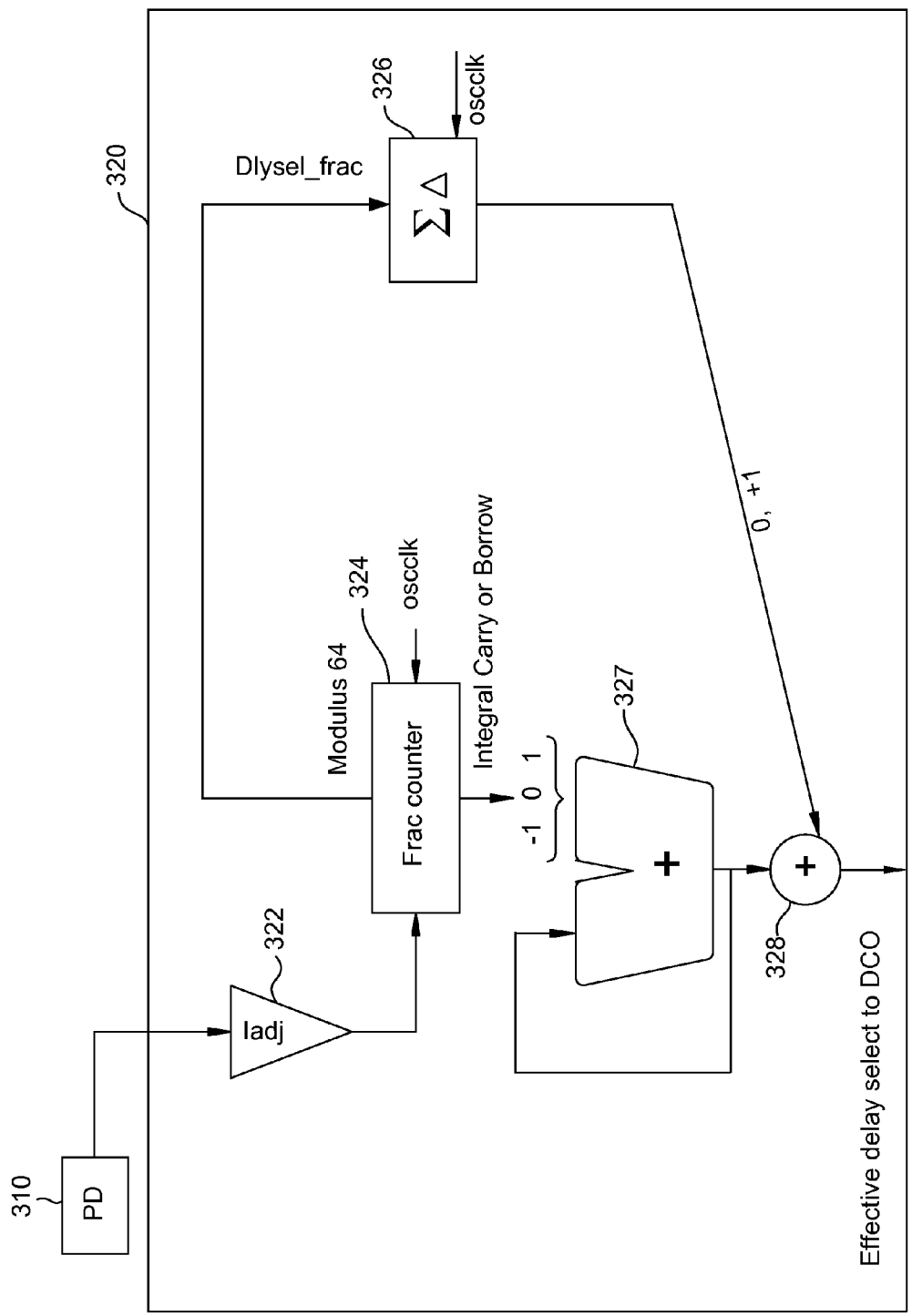
FIG. 3 illustrates a phase detector and a synthesizer control block in accordance with one embodiment of the present invention.

FIG. 3 illustrates a phase detector 310 and a synthesizer control block 320 in accordance with one embodiment of the present invention. In operation, as discussed above, phase detector 310 is coupled to receive an input clock (RefClk), and a generated clock (OscClk), and outputs a binary error signal. The binary error signal is received by the synthesizer control block 320.

In one embodiment, the synthesizer control block 320 (e.g., can be implemented as a portion of a digital frequency register) comprises an integral adjustment (Iadj) filter 322. In one embodiment, integral adjustment (Iadj) filter 322 can be perceived as a filter that applies a weight or a gain, e.g., 1 in one illustrative embodiment. The weighted error signal is then applied to a fractional counter 324. In one embodiment, fractional counter 324 comprises a Modulus_64 counter. The implementation of the fractional counter 324 as a Modulus_64 counter provides several advantages. First, this embodiment reduces period jitter and phase error in the presence of input clock jitter, e.g., for hard phase alignment mode. Second, this embodiment enables frequency alignment mode that uses multiplying factor (M) to operate at lower M values. It should be noted that the advantages of the implementation of FIG. 3 are achieved at the expense of incurring a lower rate for frequency adjustment, which may be irrelevant for fixed input frequency applications.

Furthermore, this embodiment provides a finer granularity of frequency control, thereby avoiding an overshoot condition. To illustrate, the smallest granularity of frequency change in digital synthesizers may be too large for proper synthesis, e.g., 50 ps. In other words, a 50 ps change in each period may not be practical for many applications. However, by using the fractional counter 324 implemented as a Modulus_64 counter, the change in each period will be 50/64=0.8 ps. Although the fractional counter 324 can be implemented using any other numbers, it is beneficial to use a number that is a power of 2 for ease of implementation. Although in one preferred embodiment, the fractional counter 324 is implemented as a Modulus_64 counter (broadly Modulus_N counter), it has been determined that values between 50-120 (i.e., N=50-120) can be used while showing good tracking.

One output of the fractional counter 324 provides an update magnitude signal (e.g., −1, 0, 1) depending on the input error signal. The update magnitude signal is broadly defined as an integral carry/borrow signal. The update magnitude signal is received by a signal generator (e.g., a Dlysel (delay select) generator) 327 (e.g., implemented as an arithmetic logic unit (ALU)) which provides an output signal to an adder 328. Additionally, one output of the fractional counter 324 provides a signal (e.g., labeled Dlysel_frac) to a delta sigma circuit 326. The delta sigma (also called sigma delta) circuit 326 may distribute the energy over a plurality of frequencies. The output of the delta sigma circuit 326 is also provided to the adder 328 where it is added to the output signal of the Dlysel generator 327 to produce a delay select signal that is provided to a digital controllable oscillator (not shown).

Figure 4:
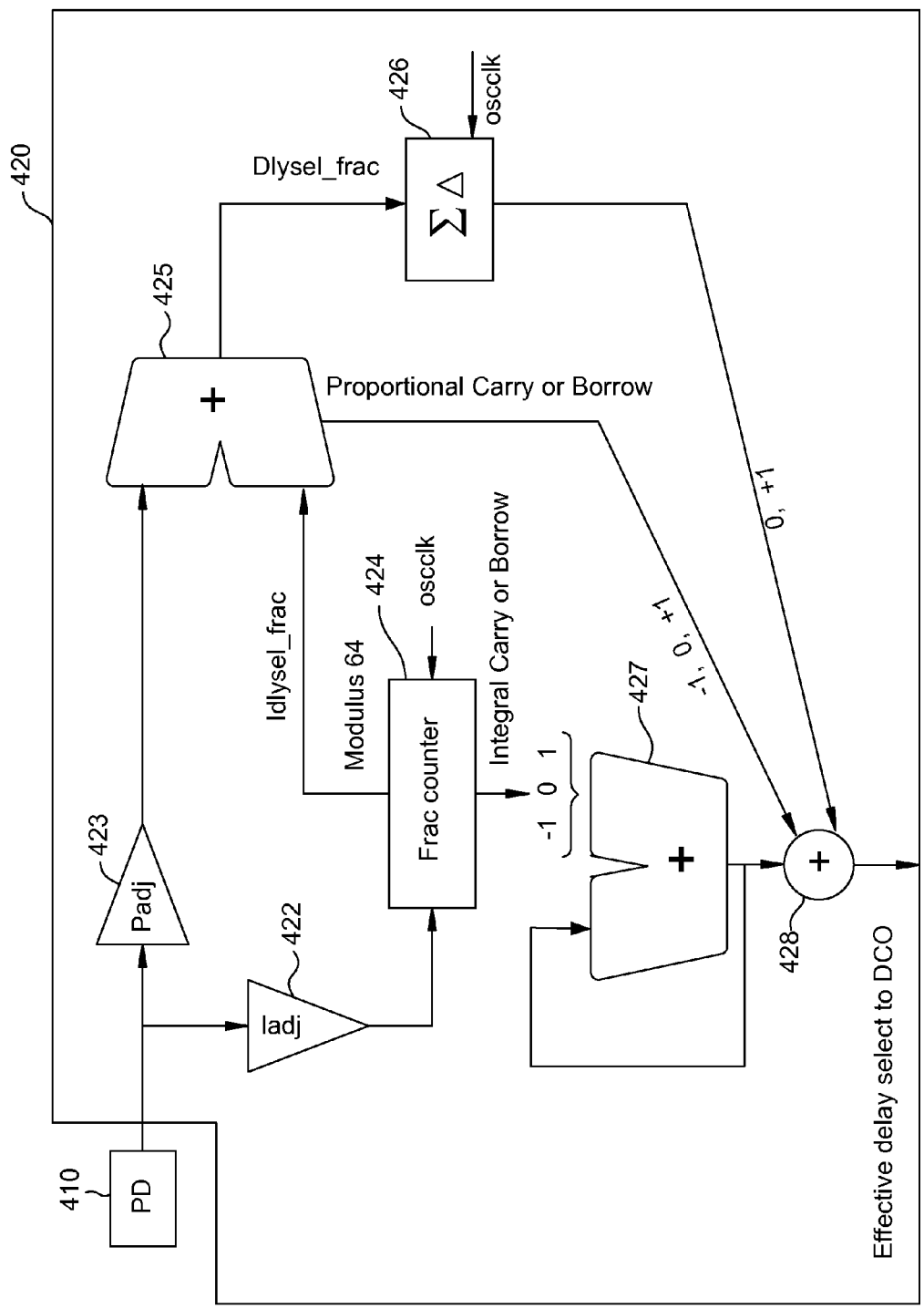
FIG. 4 illustrates a phase detector and a synthesizer control block in accordance with an alternative embodiment of the present invention.

FIG. 4 illustrates a phase detector 410 and a synthesizer control block 420 in accordance with one embodiment of the present invention. In operation, phase detector 410 is coupled to receive an input clock (RefClk), and a generated clock (OscClk), and outputs a binary error signal. The binary error signal is received by the synthesizer control block 420.

In one embodiment, the synthesizer control block 420 (e.g., can be implemented as a portion of a digital frequency register) comprises an integral adjustment (Iadj) filter 422 and a proportional adjustment (Padj) filter 423. It should be noted that the present implementation is similar to the implementation of FIG. 3, with the exception of adding a proportional adjustment (Padj) filter 423. By using two filters, this implementation provides loop stability such that a hard phase alignment is no longer needed to maintain the phase lock. One way to perceive this alternate approach is that the integral adjustment (Iadj) filter 422 serves as an integrator whereas the proportional adjustment (Padj) filter 423 applies to a current concurrence cycle. As a result, the present implementation provides the small clock jitter of a frequency aligned mode and the low phase error of the hard phase alignment mode. This implementation enables a PLL-like operation while using components that are all digital.

It should be noted that the values for Iadj and Padj can be selectively set to meet the requirements of a particular implementation. In one illustrative embodiment, it has been observed that the Iadj gain can be set to a value of 1 for providing fine frequency adjustment, while the Padj gain can be set to a value of 6 to provide stability. However, it should be noted that the Padj gain can be set within a range of 4-10 while still providing the necessary stability.

Again, in one embodiment, fractional counter 424 comprises a Modulus_64 counter. One output of the fractional counter 424 provides an update magnitude signal (e.g., −1, 0, 1) depending on the input error signal. The update magnitude signal is broadly defined as an integral carry/borrow signal. The update magnitude signal is received by a signal generator (e.g., a Dlysel (delay select) generator) 427 (e.g., implemented as an arithmetic logic unit (ALU)) which provides an output signal to an adder 428.

Additionally, one output of the fractional counter 424 provides a signal (e.g., labeled Idlysel_frac) to a signal generator 425 (e.g., implemented as an arithmetic logic unit (ALU)) which adds the Idlysel_frac signal with the output signal from the Padj filter 423. The signal generator 425 then provides an output signal (labeled Dlysel_frac) to a delta sigma circuit 426. The output of the delta sigma circuit 426 is also provided to the adder 428, where it is added to the output signal of the Dlysel generator 427 and an output signal from the signal generator 425 (broadly defined as a proportional carry/borrow signal) to produce a delay select signal that is provided to a digital controllable oscillator (not shown).

Figure 5:
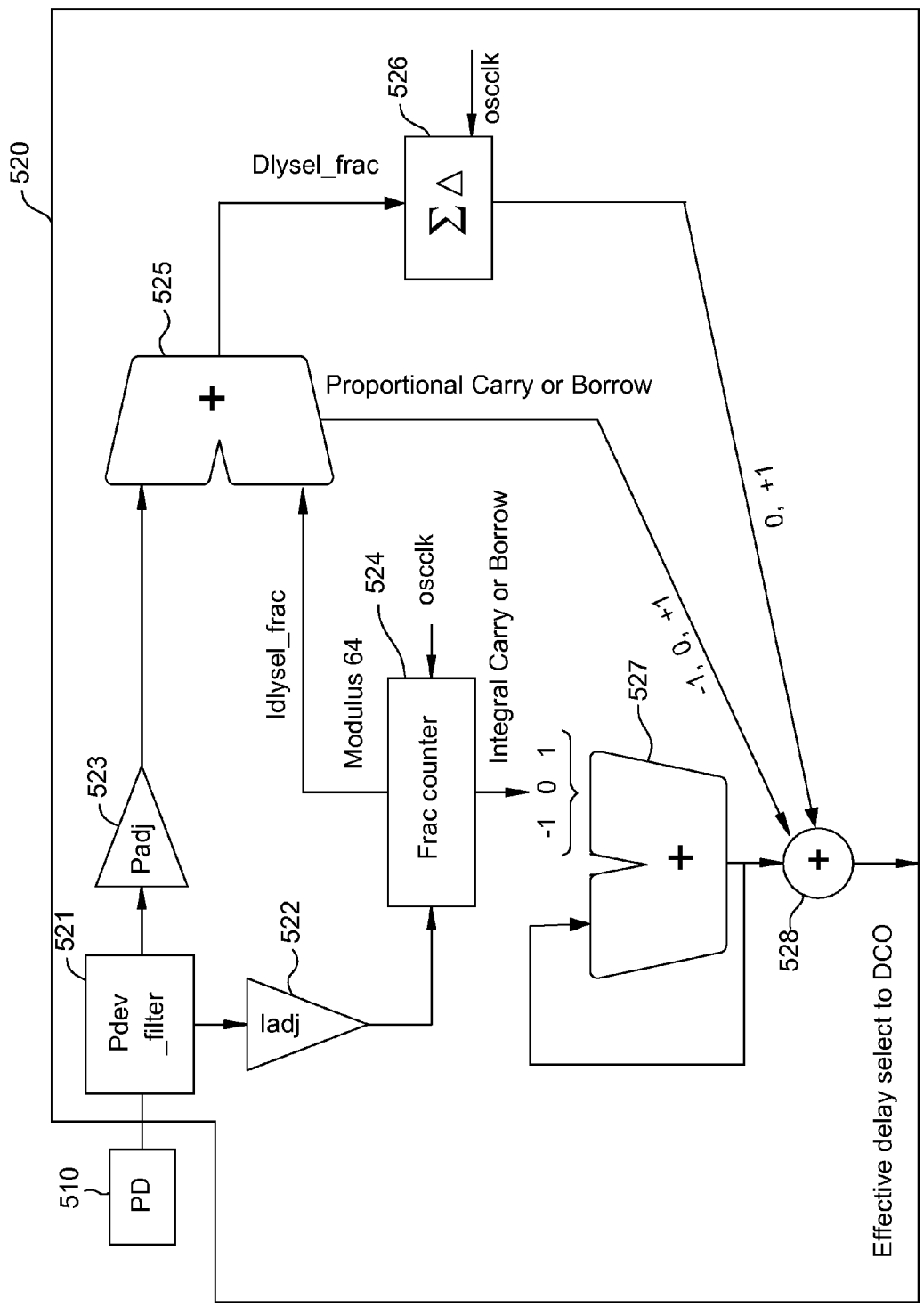
FIG. 5 illustrates a phase detector and a synthesizer control block in accordance with an alternative embodiment of the present invention.

FIG. 5 illustrates a phase detector 510 and a synthesizer control block 520 in accordance with one embodiment of the present invention. In operation, phase detector 510 is coupled to receive an input clock (RefClk), and a generated clock (OscClk), and outputs a binary error signal. The binary error signal is received by the synthesizer control block 520.

In one embodiment, the synthesizer control block 520 (e.g., can be implemented as a portion of a digital frequency register) comprises an integral adjustment (Iadj) filter 522 and a proportional adjustment (Padj) filter 523. It should be noted that the present implementation is similar to the implementation of FIG. 4, with the exception of adding a phase deviation filter 521. As higher frequencies are approached, it is necessary to ensure that the synthesizer control block 520 is able provide the expected performance. It should be noted that in one embodiment the phase detector 510 is implemented as a bang bang phase detector that only provides a direction that is needed to correct an error. Unlike a fully digital implementation, traditional PLLs are capable of providing an amount of phase deviation correction in addition to direction correction. However, there may be a need to address phase deviation in a fully digital implementation. This can be accomplished by using time domain converters (TDCs), but these devices occupy a significant amount of areas and they consume additional power.

Figure 6:
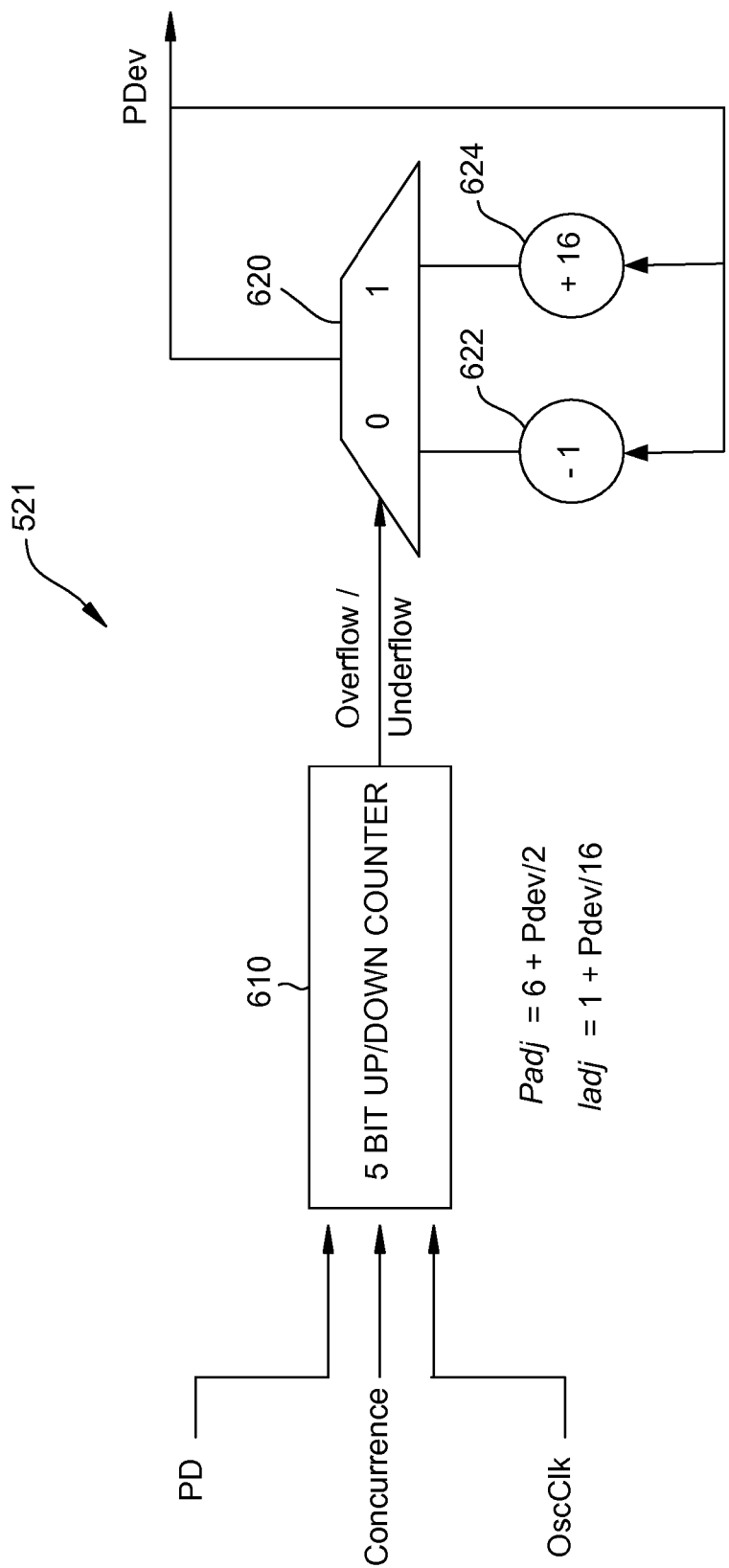
FIG. 6 illustrates one illustrative implementation of the phase deviation filter.

To address this criticality, in one embodiment a phase deviation filter 521 (broadly a filter) counts concurrences when the output of the phase detector 510 is the same to provide a measure of phase deviation. FIG. 6 illustrates one illustrative implementation of the phase deviation filter 521. In one embodiment, phase deviation filter 521 comprises a counter 610 (e.g., a 5 bit up/down counter). The counter 610 counts the number of concurrences (e.g., when REFCLK and OSCCLK or more broadly when the input clock and the output clock are in the same direction). If an overflow condition or an underflow condition (e.g., less than 0 or greater than 32 in a five bit implementation) is detected, then a control signal is applied to a multiplexer 620, where a value (e.g., +16) is selected. Alternatively, if at the expiration of a predetermined time period (e.g., 32 clock cycles and so on), and no overflow condition or underflow condition is detected, then a control signal is applied to a multiplexer 620, where a value (e.g., −1) is selected. It should be noted that the selected value from the multiplexer is applied (added or subtracted) from a current Pdev signal to generate a modified Pdev signal (e.g., broadly referred to as a modified error signal). In turn, the modified Pdev signal is forwarded to both the integral adjustment (Iadj) filter 522 and the proportional adjustment (Padj) filter 523. In one embodiment, the following equations are used to derive Iadj and Padj in accordance with Pdev:

$$Padj = P + Pdev/D1$$

$$Iadj = I + Pdev/D2,$$

where P is a value between 3-15, I is a number greater than 0. For jitter performance, a lower I value (e.g., 1) is preferred. The denominator values D1 and D2 can also be any values but are chosen as follows:
1. Are values of power of 2 for ease of implementation (e.g., D1=2, and D2=16)
2. Are values such that the ratio of P/I is substantially maintained.

The benefit of the implementation of the phase deviation filter 521 is significant. For example, it has been observed that the synthesizer control block 520 does not suffer from a very high overshoot which translates to jitter while still achieving a good settling time.

Returning to FIG. 5, in one embodiment, fractional counter 524 comprises a Modulus_64 counter. One output of the fractional counter 524 provides an update magnitude signal (e.g., −1, 0, 1) depending on the input error signal. The update magnitude signal is broadly defined as an integral carry/borrow signal. The update magnitude signal is received by a signal generator (e.g., a Dlysel (delay select) generator) 527 (e.g., implemented as an arithmetic logic unit (ALU)) which provides an output signal to an adder 528.

Additionally, one output of the fractional counter 524 provides a signal (e.g., labeled Idlysel_frac) to a signal generator 525 (e.g., implemented as an arithmetic logic unit (ALU)) which adds the Idlysel_frac signal with the output signal from the Padj filter 523. The signal generator 525 then provides an output signal (labeled Dlysel_frac) to a delta sigma circuit 526. The output of the delta sigma circuit 526 is also provided to the adder 528, where it is added to the output signal of the Dlysel generator 527 and an output signal from the signal generator 525 (broadly defined as a proportional carry/borrow signal) to produce a delay select signal that is provided to a digital controllable oscillator (not shown).

Figure 7:
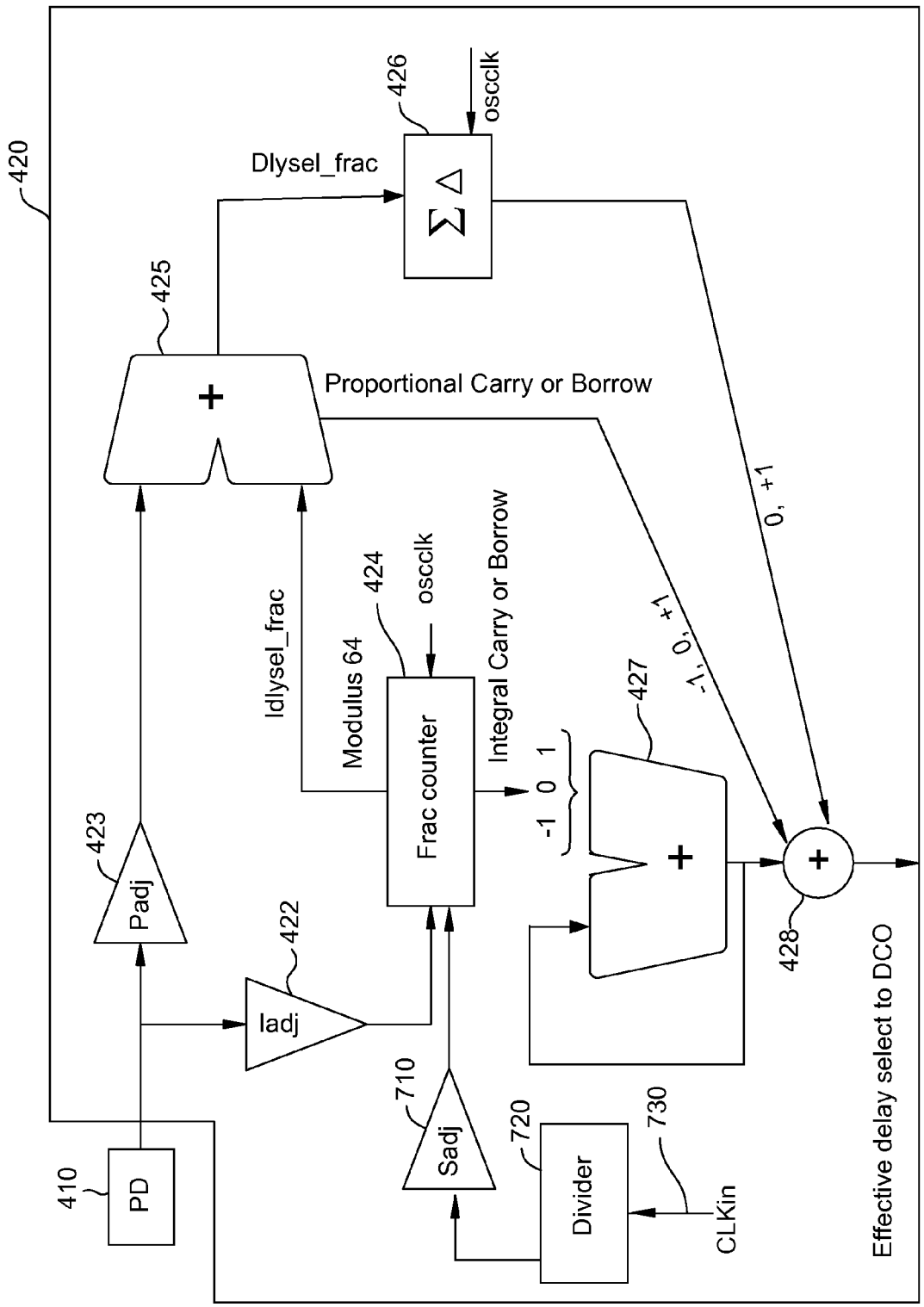
FIG. 7 illustrates a phase detector and a synthesizer control block with a capability to generate a spread spectrum signal in accordance with an alternative embodiment of the present invention.

FIG. 7 illustrates a phase detector and a synthesizer control block with a capability to generate a spread spectrum signal in accordance with an alternative embodiment of the present invention. It should be noted that the present implementation is similar to the implementation of FIG. 4, with the exception of adding a spread adjustment (Sadj) filter 710 and a divider (e.g., a clock divider) 720. As such, the operations of the common components between FIG. 4 and FIG. 7 have been described above.

In one embodiment, the present invention is capable of providing a spread spectrum signal. Spread-spectrum techniques comprise methods by which electromagnetic energy that is generated in a specific bandwidth is intentionally spread in the frequency domain, thereby resulting in a signal with a wider bandwidth. One advantage of applying the spread spectrum technique in clock generation for a digital system is to reduce the spectral density of the electromagnetic interference (EMI) that such digital system may generate. For example, a clock frequency is allowed to drift or oscillate over a target frequency, thereby allowing the energy to be spread over a range of frequencies.

In one embodiment, an input clock signal (CLKin) 730 is provided to a clock divider 720, where the frequency of the input clock signal (CLKin) is divided by a divisor value, e.g., 1024. The divided input clock signal is then provided to the spread adjustment filter 710 which will apply a weight or a gain to the divided input clock signal. In one embodiment, the weight or gain can be selected to achieve a particular spread range, e.g., a gain value (e.g., 2 or 4) will produce a spread range of approximately 2% to 5%. It should be noted that the present invention is not limited to a particular gain value or a divisor value, as provide above. The gain value and divisor value will be selected in accordance with the requirements of a particular implementation. As such, in one embodiment, the gain value and/or divisor value can be selectively programmed, e.g., by a user of the device.

In one embodiment, the fractional counter 424 receives an input from the Iadj filter 422 and causes the fractional counter 424 to provide an update magnitude signal (e.g., −1, 0, 1) depending on the input error signal. As discussed above, the update magnitude signal is broadly defined as an integral carry/borrow signal. However, unlike the embodiment as discussed above with reference to FIG. 4, the fractional counter 424 also receives an input from the Sadj filter 710. The effect is that the output of the Iadj filter 422 is used to lock onto a target frequency, whereas the output of the Sadj filter 710 is used to define a number of cycles for oscillating (increasing and decreasing) the clock frequency centered around the target frequency, thereby achieving the spread spectrum effect.

In other words, the output of the Sadj filter 710 is used to define a number of cycles for causing the oscillator to drift towards one direction in terms of frequency for a number of cycles and then to drift towards the opposite direction for the same number of cycles, but the frequency drift will be centered around the target frequency.

It should be noted that although the spread adjustment filter 710 and the divider 720 are adapted to the embodiment of FIG. 4, the present invention is not so limited. In fact, the spread adjustment filter 710 and the divider 720 can be adapted to the embodiments of FIG. 3 and FIG. 5 as well, to provide the spread spectrum effect.

It should be noted that one or more aspects of the present invention relate generally to an integrated circuit (IC). Namely, any type of ICs can be adapted to implement the present invention.

More specifically, in one embodiment, one or more aspects of the present invention relate generally to a programmable logic device (PLD). A programmable logic device (PLD) is a general-purpose device that can be programmed by a user to implement a variety of selected functions. One type of PLD is a Field Programmable Gate Array (FPGA), which typically includes an array of configurable logic blocks (CLBs) and a plurality of input/output blocks (IOBs). The CLBs are individually programmable and can be configured to perform a variety of logic functions on a few input signals. The IOBs can be configured to drive output signals from the CLBs to external pins of the FPGA and/or to receive input signals from the external FPGA pins. The FPGA also includes a programmable interconnect structure that can be programmed to selectively route signals among the various CLBs and IOBs to produce more complex functions of many input signals. The CLBs, IOBs, and the programmable interconnect structure are programmed by loading configuration data into associated memory cells that control various switches and multiplexers within the CLBs, IOBs, and the interconnect structure to implement logic and routing functions specified by the configuration data to implement a user design in the FPGA. An FPGA may also include other programmable and non-programmable resources.

In one embodiment, one or more phase detectors and synthesizer control blocks as shown in FIGS. 2-5 can be implemented as portions of one or more PLDs.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. An integrated circuit, comprising:
a phase detector for receiving a reference clock signal and an oscillator clock signal, wherein said phase detector outputs an error signal; and
a synthesizer control block, coupled to said phase detector, for receiving said error signal to generate a delay select signal, wherein said synthesizer control block comprises an integral adjustment filter and a proportional adjustment filter, wherein said synthesizer control block further comprises a phase deviation filter, wherein said phase deviation filter is coupled to said integral adjustment filter and said proportional adjustment filter, and wherein said integral adjustment filter and said proportional adjustment filter are configured to provide respective outputs for generating said delay select signal that controls an amount of delay to be applied to said oscillator clock signal;
wherein said phase deviation filter employs a counter for counting a number of concurrences of said reference clock signal and said oscillator clock signal to determine whether an overflow condition or an underflow condition exists.

2. The integrated circuit of claim 1, wherein if said overflow condition or said underflow condition exists, then a first value is added to said error signal to generate a modified error signal (Pdev), or wherein if said overflow condition or said underflow condition is not detected at an expiration of a predetermined time period, then a second value is subtracted from said error signal to generate said modified error signal (Pdev).

3. The integrated circuit of claim 2, wherein said modified error signal (Pdev) from said phase deviation filter is provided to said integral adjustment filter and said proportional adjustment filter.

4. The integrated circuit of claim 3, wherein a gain value (Iadj) for the said integral adjustment filter, and a gain value (Padj) for said proportional adjustment filter are calculated in accordance with:

$$P\text{adj}=P+P\text{dev}/D1$$

$$I\text{adj}=I+P\text{dev}/D2$$

where P is a value between 3-5, where I is a number greater than 0, and where D1 and D2 are values of power of 2.

5. The integrated circuit of claim 1, further comprising a fractional counter coupled to said integral adjustment filter.

6. The integrated circuit of claim 5, wherein said fractional counter comprises a modulus N counter, where N is a value between 50-120.

7. The integrated circuit of claim 6, wherein said synthesizer control block further comprises a first signal generator coupled to said fractional counter and a second signal generator coupled to said fractional counter and said proportional adjustment filter.

8. The integrated circuit of claim 7, wherein said synthesizer control block further comprises a delta sigma circuit coupled to said second signal generator.

9. The integrated circuit of claim 8, wherein said synthesizer control block further comprises an adder, wherein said adder is coupled to said delta sigma circuit, said first signal generator, and said second signal generator, and wherein said adder is for generating said delay select signal.

10. The integrated circuit of claim 1, wherein said integrated circuit comprises a programmable logic device (PLD).

11. An integrated circuit, comprising:
a phase detector for receiving a reference clock signal and an oscillator clock signal, wherein said phase detector outputs an error signal; and
a synthesizer control block, coupled to said phase detector, for receiving said error signal to generate a delay select signal, wherein said synthesizer control block comprises:
an integral adjustment filter;
a proportional adjustment filter, wherein said error signal is provided to said integral adjustment filter and said proportional adjustment filter, and wherein said integral adjustment filter and said proportional adjustment filter are configured to provide respective outputs for generating said delay select signal that controls an amount of delay to be applied to said oscillator clock signal;

a fractional counter coupled to said integral adjustment filter;
a first signal generator; and
a second signal generator;
wherein the first and second signal generators are coupled to receive respective outputs from the fractional counter, and wherein the second signal generator is coupled to receive the output from the proportional adjustment filter.

12. The integrated circuit of claim 11, wherein said fractional counter comprises a modulus 64 counter.

13. The integrated circuit of claim 12, wherein said synthesizer control block further comprises a delta sigma circuit coupled to said second signal generator.

14. The integrated circuit of claim 13, wherein said synthesizer control block further comprises an adder, wherein said adder is coupled to said delta sigma circuit, said first signal generator, and said second signal generator, and wherein said adder is for generating said delay select signal.

15. The integrated circuit of claim 14, wherein said integrated circuit comprises a programmable logic device (PLD).

16. An integrated circuit, comprising:
a phase detector for receiving a reference clock signal and an oscillator clock signal, wherein said phase detector outputs an error signal;
a synthesizer control block, coupled to said phase detector, for receiving said error signal to generate a delay select signal, wherein said synthesizer control block comprises:
an integral adjustment filter;
a proportional adjustment filter, wherein said error signal is provided to said integral adjustment filter and said proportional adjustment filter, and wherein said integral adjustment filter and said proportional adjustment filter are configured to provide respective outputs for generating said delay select signal that controls an amount of delay to be applied to said oscillator clock signal;
a spread adjustment filter;
a fractional counter coupled to said integral adjustment filter and said spread adjustment filter;
a first signal generator; and
a second signal generator;
wherein the first and second signal generators are coupled to receive respective outputs from the fractional counter, and wherein the second signal generator is coupled to receive the output from the proportional adjustment filter.

* * * * *